United States Patent
Carpenter et al.

(10) Patent No.: US 9,251,913 B2
(45) Date of Patent: Feb. 2, 2016

(54) INFRASTRUCTURE FOR PERFORMANCE BASED CHIP-TO-CHIP STACKING

(75) Inventors: Gary Dale Carpenter, Austin, TX (US);
Alan James Drake, Austin, TX (US);
Eren Kursun, Austin, TX (US); Phillip John Restle, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1244 days.

(21) Appl. No.: 13/156,836

(22) Filed: Jun. 9, 2011

(65) Prior Publication Data

US 2012/0313647 A1    Dec. 13, 2012

(51) Int. Cl.
*G01R 27/28* (2006.01)
*G11C 29/02* (2006.01)
*G01R 31/28* (2006.01)
*G11C 7/10* (2006.01)
*H01L 25/065* (2006.01)
*G11C 29/50* (2006.01)

(52) U.S. Cl.
CPC .......... *G11C 29/025* (2013.01); *G01R 31/2882* (2013.01); *G11C 7/10* (2013.01); *G11C 29/50012* (2013.01); *H01L 25/0657* (2013.01); *H01L 2225/06541* (2013.01); *H01L 2924/0002* (2013.01)

(58) Field of Classification Search
CPC ............. G11C 29/025; G01R 31/2882; H01L 25/0657; H01L 2924/0002
USPC .................................. 324/612, 600, 691–719, 324/759.01–763.01, 500
See application file for complete search history.

(56) References Cited

U.S. PATENT DOCUMENTS

| | | | |
|---|---|---|---|
| 7,203,920 B2 | 4/2007 | Chandra | |
| 7,487,012 B2 | 2/2009 | Bose et al. | |
| 7,526,739 B2 | 4/2009 | McIlrath | |
| 8,373,439 B2 * | 2/2013 | Or-Bach | 326/38 |

(Continued)

FOREIGN PATENT DOCUMENTS

EP    547349    6/1993

OTHER PUBLICATIONS

Muckerjee et al; "Simultaneous Scheduling, Binding and Layer Assignment for Synthesis of Vertically Integrated 3D Systems" Department of ECECS, University of Cincinnati.

(Continued)

*Primary Examiner* — Melissa Koval
*Assistant Examiner* — Trung Nguyen
(74) *Attorney, Agent, or Firm* — Garg Law Firm, PLLC; Rakesh Garg; William J. Stock

(57) ABSTRACT

A method and system for an infrastructure for performance-based chip-to-chip stacking are provided in the illustrative embodiments. A critical path monitor circuit (infrastructure) is configured to launch a signal from a launch point in a first layer, the first layer being a first circuit. The infrastructure is further configured to create an electrical path to a capture point. The signal is launched from the launch point in the first layer. A performance characteristic of the electrical path is measured, resulting in a measurement, wherein the measurement is indicative of a performance of the first layer when stacked with a second layer in a 3D stack without actually stacking the first and the second layers in the 3D stack, the second layer being a second circuit.

20 Claims, 7 Drawing Sheets

(56) References Cited

U.S. PATENT DOCUMENTS

| | | |
|---|---|---|
| 2008/0281476 A1 | 11/2008 | Bose et al. |
| 2010/0153895 A1 | 6/2010 | Tatelbaum et al. |
| 2010/0194434 A1 | 8/2010 | Tran Vo et al. |
| 2010/0201377 A1 | 8/2010 | Arsovski et al. |
| 2010/0333057 A1 | 12/2010 | Tang et al. |
| 2011/0091157 A1* | 4/2011 | Yao et al. ......... 385/42 |

OTHER PUBLICATIONS

Lin et al; "Performance Benefits of Monolithically Stacked 3-D FPGA", IEEE Transactions of Computer-Aided Design of Integrated Circuits and Systems, vol. 26, No. Feb. 2007.

* cited by examiner

INFRASTRUCTURE FOR PERFORMANCE BASED CHIP-TO-CHIP STACKING

RELATED APPLICATION

The present invention is related to similar subject matter of co-pending and commonly assigned U.S. patent application Ser. No. 13/087,464 entitled "BONDING CONTROLLER GUIDED ASSESSMENT AND OPTIMIZATION FOR CHIP-TO-CHIP STACKING," filed on Apr. 15, 2011, which is hereby incorporated by reference.

BACKGROUND

1. Technical Field

The present invention relates generally to a method, system, and computer program product for creating integrated circuits. More particularly, the present invention relates to an infrastructure for determining the performance of separate integrated circuit chips when stacked into a stack of chips, such as in three dimensions (3D stack) or in a common two dimensional plane (2D stack), or in a package-to-package, chip-to-chip, or package-to-chip coupling using 2D or 3D stacks.

2. Description of the Related Art

Modern day electronics include components that use integrated circuits. Integrated circuits are electronic circuits formed using Silicon as a substrate and by adding impurities to form solid-state electronic devices, such as transistors, diodes, and resistors. Commonly known as a "chip", an integrated circuit (IC) is generally individually encased in hard plastic forming a package. The components in modern day electronics generally appear to be rectangular black plastic pellets with connector pins protruding from the plastic encasement. Often, many such packages are electrically coupled so that the chips therein form an electronic circuit to perform certain functions.

Circuit designers use a variety of software tools to design electronic circuits that accomplish an intended task. For example, a digital circuit may be designed to accept digital inputs, perform some computation, and produce a digital output. An analog circuit may be designed to accept analog signals, manipulate the analog signals, such as my amplifying, filtering, or mixing the signals, and produce an analog or digital output. Generally, any type of circuit can be designed as an IC.

The software tools used for designing ICs produce, manipulate, or otherwise work with the circuit layout at very small scales. Some of the components that such a tool may manipulate may only measure tens of nanometer across when formed in Silicon. The designs produced and manipulated using these software tools are complex, often including millions of such components interconnected to form an intended electronic circuitry. A wire is a connection between parts of electronic components, and is formed using a metallic material that conducts electricity. A conducting path in an IC, such as a wire, is also known as a back-end macro. The set of electronic components implementing logic or a function is called a front-end macro.

An IC may use many layers of silicon to implement a circuit. In other words, components forming the circuit may be placed on different layers of silicon in a chip. Interconnects connecting the components on one layer to components on different layers go through the silicon layer. Such interconnects are also known as through silicon vias (TSVs).

In an effort to further reduce the footprint of electronic circuits, different chips are being stacked together in a single package. Stacking chips together into a common package is called chip-to-chip stacking. For example, a processor chip and a memory chip, each possibly formed using multiple layers, may be stacked to occupy a smaller area on a circuit board, or to consume less power, as compared to using separate processor and memory chips.

SUMMARY

The illustrative embodiments provide a method and system for an infrastructure for performance-based chip-to-chip stacking. An embodiment configures a critical path monitor circuit (infrastructure) to launch a signal from a launch point in a first layer, the first layer being a first circuit. The embodiment further configures the infrastructure to create an electrical path to a capture point. The embodiment launches the signal from the launch point in the first layer. The embodiment measures a performance characteristic of the electrical path resulting in a measurement, wherein the measurement is indicative of a performance of the first layer when stacked with a second layer in a 3D stack without actually stacking the first and the second layers in the 3D stack, the second layer being a second circuit.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
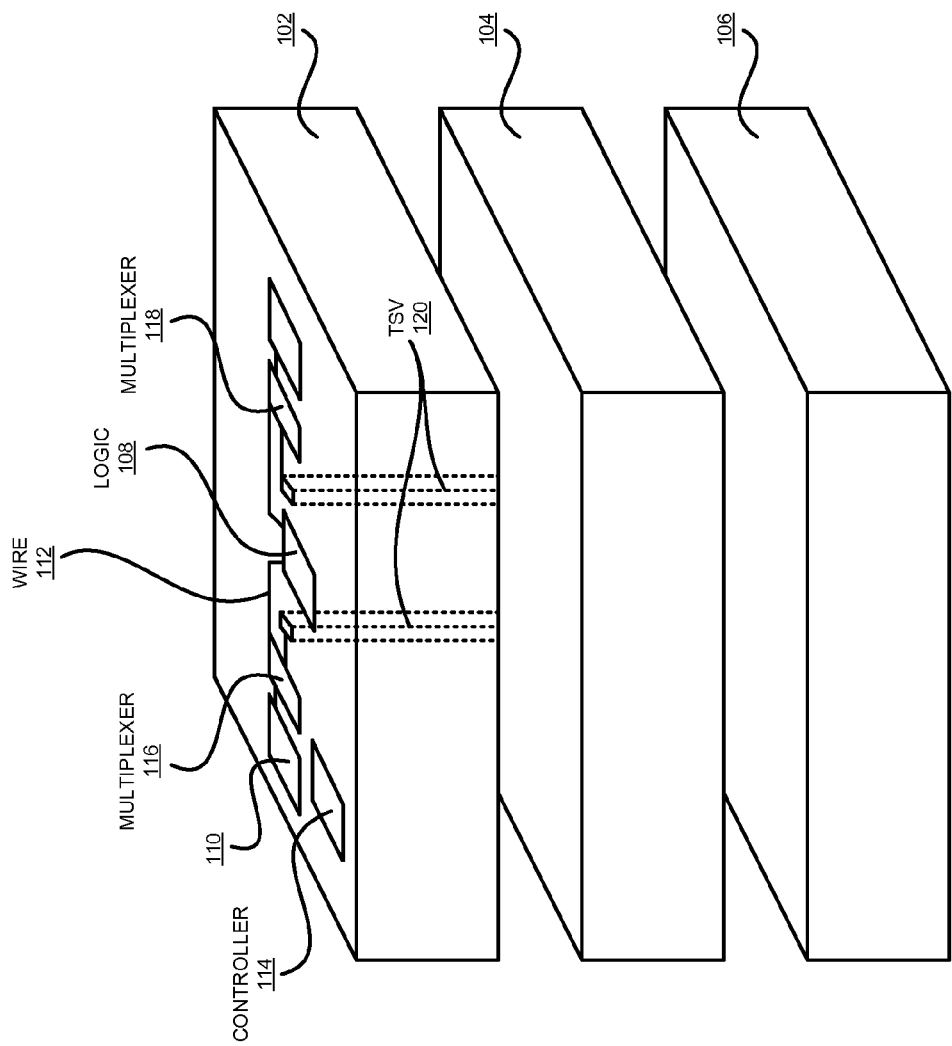
FIG. 1 depicts a block diagram of example chips in a 3D stack and including stacked performance characterization infrastructure in accordance with an illustrative embodiment.

Presently, the chips that are planned for stacking are determined to be functional, such as by assuring that a known good die has been determined for the chip's design. Then, the chips are stacked to assure that they remain functional in the stack.

The invention recognizes that merely ensuring that the stacked chips remain functional or characterizing individual layers only without stack-level evaluation is not sufficient for many implementations. The performance of the stack is dependent on not only the individual functional layers but also the relationship of those layers in the stack. Because this information is not available at the manufacturing stage the stack integration is not presently optimized. For stack performance optimization the layer characteristics with respect to each other and with respect to the overall stack definition have to be optimized to yield an optimal stacking solution.

The invention recognizes, for example, that a chip's performance normally deteriorates with rising temperature. The invention also recognizes that chip-to-chip stacking causes the temperature in the vicinity of a stacked chip to rise more than when the chip is not stacked. Therefore, the invention recognizes that the same chip is likely to perform differently in stacked and unstacked (single stratum) configurations or when the stack layer ordering is changed.

As some other examples, the invention recognizes that different chips perform differently when subjected to different operating voltages, frequencies or both. When a chip is used in an unstacked configuration, a circuit may be able to supply the desired operating voltage or frequency for that chip. The invention recognizes, however, that when chips are stacked, a common operating voltage or frequency for the entire stack may not be optimal operating conditions for at least some of the chips in the chip-to-chip stack. Thus, the invention recognizes that while the chips in the stack may remain functional, their performance in the stack will deteriorate, causing unintended consequences in the chip's circuit or elsewhere.

The invention recognizes that the chips being integrated in a chip-to-chip 3D stack may differ significantly in their specifications. For example, two chips being considered for stacking may have different operating voltage ranges with different tolerances. The differences in the specifications can in turn influence the overall stack performance. If the chips selected for stacking are not carefully selected with due regard to these differing specifications, the adverse affect on the performance of the stacked chips can void or at least significantly reduce any performance gain to be had from stacking the chips.

A critical path is an electrical path through a chip's circuit, including front-end macros and back-end macros (back-end interconnect components) that may affect a performance metric beyond a threshold. For example, a logic component on the chip, when connected using certain back-end macros on the chip when the chip is stacked, may cause a timing delay to exceed a threshold. A 3D critical path is a path in a chip that is a critical path when the chip is stacked in a 3D stack with other chips.

Many other factors affect the performance of a 3D stack in a similar manner. Such factors are called 3D performance determinants, and a 3D critical path is an example thereof. Various embodiments are described herein using a 3D critical path only as an example 3D performance determinant without implying any limitation on the invention.

The invention further recognizes that critical paths in a 3D stack can span multiple device layers. Therefore, inter-layer variation is difficult to factor in, to estimate stack performance using currently available methodology for single stratum, or single chip (2D) estimation techniques.

The invention recognizes that given N individual chips from M wafers, which chip should be integrated with which other chip is a non-trivial problem. The problem becomes even more complex especially when the candidate chips for stacking number in the thousands and their stacking order and combinations are a combinatorial factor of their numbers. The invention recognizes that selecting suitable chips to integrate with other suitable chips in a suitable order of integration, when many chips exhibit variations in their specifications, is difficult to make when the objective is to improve the stack's timing performance, energy efficiency, or other performance characteristics.

Pre-stacking characterization without stack optimization is insufficient as described above, and post-stacking assessment of delay characteristics is too late for the chip-to-chip stacking decisions. Once a stacking design is committed, making changes to the stacking is expensive and complex. Therefore, the invention recognizes that the stacking selection and ordering decisions have to be enabled pre-integration.

However, the invention also recognizes that 3D-specific delay and variation characterization is limited or non-existent in current 3D stacking design flows. The invention recognizes that special infrastructure on the chips being stacks is needed to be fabricated onto the chips to enable the pre-integration assessment of 3D stack performance characteristics.

The temperature, voltage, and frequency are described above only as example operating conditions that affect the performance of chips in chip-to-chip stacks. These operating conditions are used in the disclosure to maintain clarity of the description and not as a limitation on the invention. Many operating conditions other than temperature, voltage, and frequency will be apparent from this disclosure to those of ordinary skill in the art. For example, leakage current may be another operating condition that may change as a result of chip-to-chip stacking.

The illustrative embodiments used to describe the invention generally address and solve the above-described problems and other problems related to chip-to-chip stacking. The illustrative embodiments provide a method, system, and apparatus for an infrastructure for performance-based chip-to-chip stacking in 3D stacked integrated circuits. An embodiment describes an infrastructure (including the controller) that is usable for making performance assessment and optimization for chip-to-chip stacking. The infrastructure is a critical path monitoring architecture that can be fabricated together with the functional circuit of the chip in question.

The infrastructure is usable for determining a chip's performance characteristics in a stack before the chip is stacked. The infrastructure is also usable for altering the chip's performance characteristics after the chip has been placed in a 3D stack and the 3D stack is operational.

An implementation may use an embodiment with respect to less than all the chips in a contemplated stack without departing the scope of the invention. For example, an implementation may stack chips that have the infrastructure described herein together with chips that do not. In such a case, only the chips that include the infrastructure may be assessed for 3D-stacking performance characteristics within the scope of the invention.

The illustrative embodiments are described with respect to certain ICs or circuits only as examples. Such descriptions are not intended to be limiting on the invention. For example, an illustrative embodiment described with respect to a microprocessor chip can be implemented with respect to a memory or a device-controller chip without departing the scope of the invention.

Furthermore, the illustrative embodiments are generally described with respect to a 3D stacking without an express or implied limitation on the applicability of the invention to a three-dimensional stacking. In other words, an embodiment is not intended to limit the invention to merely those configurations where a (two dimensional) chip is stacked on top of another chip (in the third dimension), but also to those stacking configurations where a (two dimensional) chip is positioned adjacent to another chip (both chips in the same two dimensional plane).

Furthermore, the invention contemplates multi-chip-module (MCM) configurations within its scope as well. An MCM configuration is formed when multiple chips are grouped into a package, stacked vertically, stacked horizontally, not stacked adjacent to one another but electrically coupled with one another within a single package, or a combination thereof. For example, in an MCM configuration, the TSV would be replaced by a wire path on the package. An embodiment may then be used to characterize package paths in the manner described herein within the scope of the invention. For example, an implementation may create a looped path on the package that may be measured using an embodiment.

The illustrative embodiments are described with respect to certain data, data structures, file-systems, file names, directories, and paths only as examples. Such descriptions are not intended to be limiting on the invention. For example, an illustrative embodiment described with respect to a table and path can be implemented as a flat file, an index file, or a database within the scope of the invention.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting on the illustrative embodiments. Additional data, parameters, considerations, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
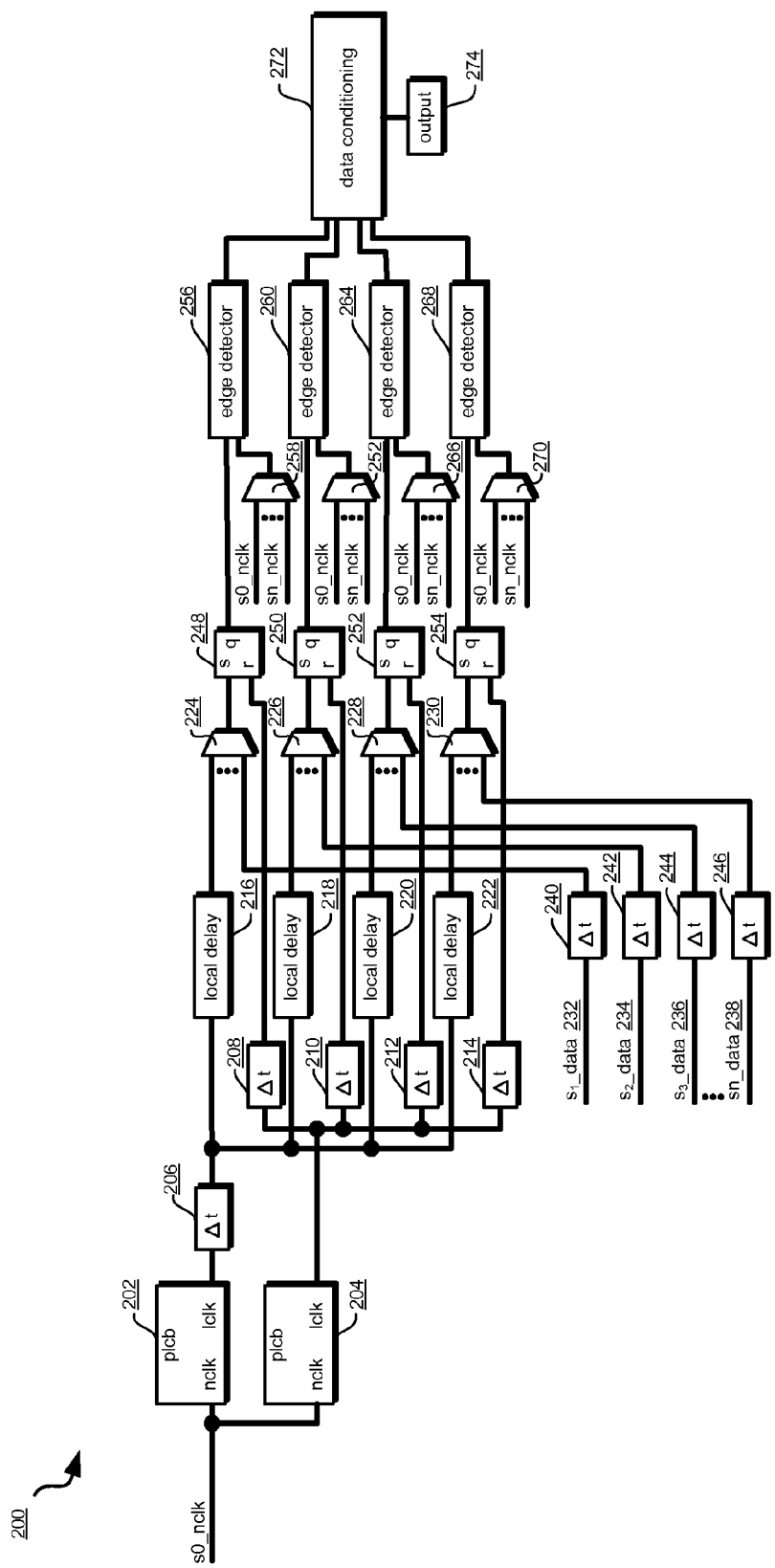
FIG. 2 depicts a block diagram of a part of the infrastructure for performance-based chip-to-chip stacking in accordance with an illustrative embodiment.

With reference to the figures and in particular with reference to FIGS. 1 and 2, these figures are example diagrams of data processing environments in which illustrative embodiments may be implemented.

With reference to FIG. 1, this figure depicts a block diagram of example chips in a 3D stack and including stacked performance characterization infrastructure in accordance with an illustrative embodiment. Chips 102, 104, and 106 may each be a functional chip of same or different type. Logic 108 may be a front-end macro on a 3D critical path in chip 102.

Logic 108 is coupled to other component 110 using wire 112. Logic 108 is similarly shown to be coupled to other components with wires (not labeled individually). Bonding controller 114 (controller) and one or more of multiplexers 116 and 118 are parts of the 3D stacked performance characterization infrastructure (infrastructure). TSVs 120 allow logic 108 to be coupled to other components on chips 104 and 106. Other parts of such an infrastructure may include sensors not depicted in this figure.

The infrastructure including bonding controller 114 and multiplexers 116 and 118 is described in greater detail with respect to subsequent figures in this disclosure. Functionally, among other operations, controller 114 and a multiplexer, such as multiplexer 116, operate to couple logic 108 with component 110 using a TSV, such as TSV 120. More precisely, bonding controller 114 can signal multiplexer 116 to activate TSV 120, to wit, use all or some of TSV 120, in the 3D critical path.

As another operation, bonding controller 114, multiplexers 116 and 118, and other parts of the infrastructure, such as sensors, allow measuring one or more performance parameters when logic 108 operates in actual or simulated 3D stack. For example, TSV 120 may not be used when chip 102 operates in unstacked configuration, and used when chip 102 operates in a stack with chips 104 and 106. In other words, TSV 120 may be an example of a cross-stratum interconnect. In such a case, the infrastructure allows measuring a delay when the front-end macros in a 3D critical path include logic 108 and the back-end macros include TSV 120.

As another optional operation, bonding controller 114 may compute the signals that should be sent to multiplexer 116 to activate TSV 120. Whether the signals are computed or received at controller 114, as another operation, bonding controller 114 transmits those signals to multiplexer 116 to activate TSV 120.

Note that the infrastructure allows computing combined delays of 3D critical paths without actually having to stack chip 102 with chips 104 or 106. The infrastructure is usable for collecting the combined delay or other 3D stacked performance characteristic measurement in a single stratum configuration of chip 102.

The infrastructure is described as activating or deactivating TSVs 120 only as an example and not as a limitation on the infrastructure or an embodiment of the invention. For example, a multiplexer, such as multiplexer 116, in the infrastructure according to an embodiment may activate or deactivate any delay component that contributed to a combined delay, or any other component that contributed to a 3D stacked performance characteristic, in a similar manner. For example, a pad on chip 102 (not shown), a pad on chip 104 (not shown), with some dielectric there between (not shown) may form a capacitive coupling that may act as a delay component when chip 102 is stacked adjacent to chip 104. The infrastructure is usable to determine a performance characteristic of a chip where such delay components may participate in a 3D stacked configuration in a similar manner. Many other types of delay components will become apparent from this disclosure to those of ordinary skill in the art and the same are contemplated within the scope of the invention.

Furthermore, the infrastructure including controller 114, one or more multiplexers, such as multiplexers 116 and 118, and one or more sensors, is usable in multiple modes. In one mode, the infrastructure is used in a testing mode to collect the 3D stacked performance characterization data from a given chip in single stratum configuration. In another mode, once the chips are committed in a stack, the infrastructure can be used to activate or deactivate certain delay components or other components that contribute to another performance parameter, so as to fine-tune the stack for achieving a desired performance from the stack. For example, while in a stack, a TSV in a chip in the stack may be deactivated to reconfigure a 3D critical path thereby improving a delay value of a timing performance parameter of the stack.

With reference to FIG. 2, this figure depicts a block diagram of a part of the infrastructure for performance-based chip-to-chip stacking in accordance with an illustrative embodiment. Portions of depicted part 200 of the infrastructure may be implemented as a combination of component 110, multiplexer 116, wire 112, and logic 108 in FIG. 1. Part 200 of the infrastructure depicted herein may be implemented on a chip, such as chip 102 in FIG. 1.

For notation purposes, part 200 is assumed to be implemented on chip 0, to wit, a chip at level 0 (strata 0) in a planned 3D stack. Accordingly, subscript "0" to any value or parameter described with respect to FIG. 4 refers to that value or parameter in chip 0. Similarly, other chips will be referred to as chip 1, chip 2, . . . chip n, referring to their respective positions in the contemplated 3D stack (strata 1, 2, . . . n). Values or parameters pertaining to such other chips will accordingly bear the subscript corresponding to the chip's position.

Part 200 of an infrastructure according to an embodiment is configured to detect a level. Particularly, part 200 sends a pulse through a delay path and detects an edge after the pulse has traversed the delay path.

In one embodiment, part 200 is configured to detect the same pulse, such as a rising edge, for each clock cycle. Part 200 is shown to be configured for four delay paths in the functional circuit of chip 0 but may be similarly configured for any number of delay paths within the scope of the invention.

Pulsed local clock buffer (plcb)(. 202 is a pulse generating circuit to provide a timing signal for chip 0 on which part 200 is fabricated. Plcb 204 provides a reset signal.

Components 206, 208, 210, 212, and 214 are programmable delay components, each of which can be independently manipulated to apply a predetermined amount of delay to corresponding component 206's, 208's, 210's, 212's, or 214's input signal. Component 206 provides a programmable delay to chip 0's timing signal, whereas components 208, 210, 212, and 214 provide programmable reset delays.

Local delays 216, 218, 220, and 222 are example local delay paths in the functional circuit of chip 0. Multiplexer 224, 226, 228, and 230 each receives the signal after the signal has traversed corresponding local delay 216, 218, 220, and 220 respectively on chip 0. Any subset of multiplexers 224, 226, 228, and 230 may further receive a similarly delayed signal from any of the other n layers in the contemplated stack. For example, s1_data 232 may be a signal that has traversed a delay path of chip 1, s2_data 234 may be a signal that has traversed a delay path of chip 2, s3_data 236 may be a signal that has traversed a delay path of chip 3, and sn_data 238 may be a signal that has traversed a delay path of chip n.

Delay component 240 may manipulate the delay of the signal 232 such that the signal is aligned with a corresponding clock. Delay components 242, 244, and 246 apply programmable delays in a similar manner to signals 234, 236, and 238 respectively.

Outputs of multiplexers 224, 226, 228, and 230 are latched at set-reset latches 248, 250, 252, and 254 respectively. Edge detector 256 receives the output of set-reset latch 248 as well as the clock signals of one or more other layers via multiplexer 258. More than one clock inputs at edge detector 256, such as the clock signals from other layers, allows edge detector 256 to determine a timing margin between the layers of the contemplated 3D stack. Alternatively, More than one clock inputs at edge detector 256, such as the clock signals from other layers, allows edge detector 256 to select the clock of a particular layer for a particular measurement.

Edge detectors 260, 264, and 268 operate in conjunction with multiplexers 262, 266, and 270 respectively in a similar manner. Launching a signal and a clock from one layer to another, such a from launching from layer n and capturing at layer 0, allows a reference for the signal at the capturing layer (layer 0 in this example) so that an embodiment can determine the delay effects of any TSVs that the signal may have passed through.

Multiplexers 224, 226, 228, 230, 258, 262, 266, and 270 allow determining the performance of layer-to-layer (chip-to-chip_communications. Programmable delay components 206, 208, 210, 212, 214, 240, 242, 244, and 246 allow an independent design of the infrastructure according to an embodiment. For example, a designer of a functional circuit of a chip need not consider the requirements of the infrastructure according to an embodiment during the design of the functional circuit. Once the design of the functional circuit is ready, the infrastructure can be tuned, such as by using one or more programmable delay components, to adapt to the functional design's timing targets, tolerances, and other performance criteria. Thus, the programmable delay components allow adaptation of the infrastructure according to an embodiment to a wide range of chips having a wide range of timing requirements. Furthermore, different local delay paths in a functional circuit may require different programmable delays. Programmable delay components 206, 208, 210, 212, 214, 240, 242, 244, and 246 allow independently tuning the delay amount for each local path whose 3D criticality and performance impact are to be determined.

Data conditioning component 272 may implement any treatment of the outputs of edge detectors 256, 260, 264, and 268, and produces output 274. For example, in one embodiment, data conditioning component 272 may output single sample information, worst case information, maximum-minimum spread, average value, other types of signal analyses, or a combination thereof.

As an example, during design of the infrastructure, particularly of part 200, all local delays 216, 218, 220, and 222 may be the same. During fabrication of the functional circuit of chip 0, however, local delays 216-222 may differ from each other slightly. The edges arriving at edge detectors 256, 260, 264, and 268 will therefore not be aligned with each other. Programmable delay components 206-214 and 240-246 can be tuned to make all the edges align again even after the manufacturing imperfections.

Once tuned in this manner, the functional circuit of chips 0-*n* can be tested as described elsewhere for determining the performance characteristics in stacked configurations. After testing a particular stack configuration, chips 0-*n* may be committed to such a stack and the stack may be operated with the tuned values of the various programmable delay components intact.

During the operation of the stack, an operational condition may change. For example, voltage for chip 3 may drop, or aging of chip n may cause an increase in the leakage current. Appropriate programmable delay components may be readjusted for applying a different delay value to compensate for the performance creep during operation, operating condition change, or a combination thereof.

Output block 274 can be coupled to any type of feedback circuit to adjust a performance parameter or operating condition. For example, in case of a voltage droop in example chip 3, output block 274 may be coupled to a voltage regulator to adjust the voltage.

Figure 3A:
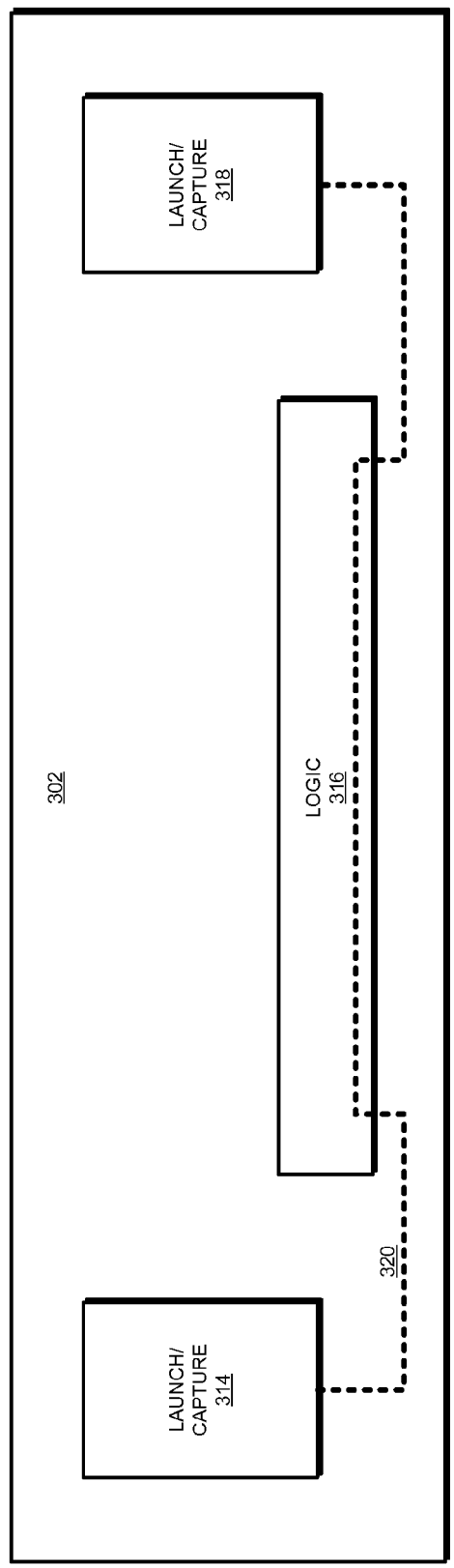
FIG. 3A depicts a block diagram of an example delay path configured for a performance measurement using an infrastructure in accordance with an illustrative embodiment.

With reference to FIG. 3A, this figure depicts a block diagram of an example delay path configured for a performance measurement using an infrastructure in accordance with an illustrative embodiment. Certain components of the infrastructure, such as the multiplexers, controller, or sensors (edge detectors), are not depicted for the clarity of the drawing and the description.

Chip 302 may be similar to chip 102 in FIG. 1, and may implement part 200 of the infrastructure according to FIG. 2. Launch and capture block (block) 314 may be analogous to component 110 in FIG. 1. Block 318 may be another block on chip 302 similar to block 314. Logic 316 may be similar to logic 108 in FIG. 1 or any one of local delays 216, 218, 220, or 222 in FIG. 2. Generally, any type of chip resource or component that may participate in a path may be used as a substitute for logic 316 within the scope of the invention.

Path 320 is a path created using components of the infrastructure, for example, the controller and one or more multiplexers (not shown). For example, the controller may signal certain multiplexers to activate the signal path between block 314 and logic 316, and between block 318 and logic 316, such that path 320 is formed. A sensor, such as any of edge detectors 256, 260, 264, or 268 in FIG. 2 (not shown in FIG. 3A) may then detect a delay along path 320.

Configured in this manner, a signal being launched in chip 302, traversing a delay path in chip 302, and being captured in chip 302, can be evaluated to determine a performance characteristic of path 320. Thus, a performance characteristic of a delay path in chip 302 can be evaluated while keeping chip 302 in single-stratum mode.

Figure 3B:
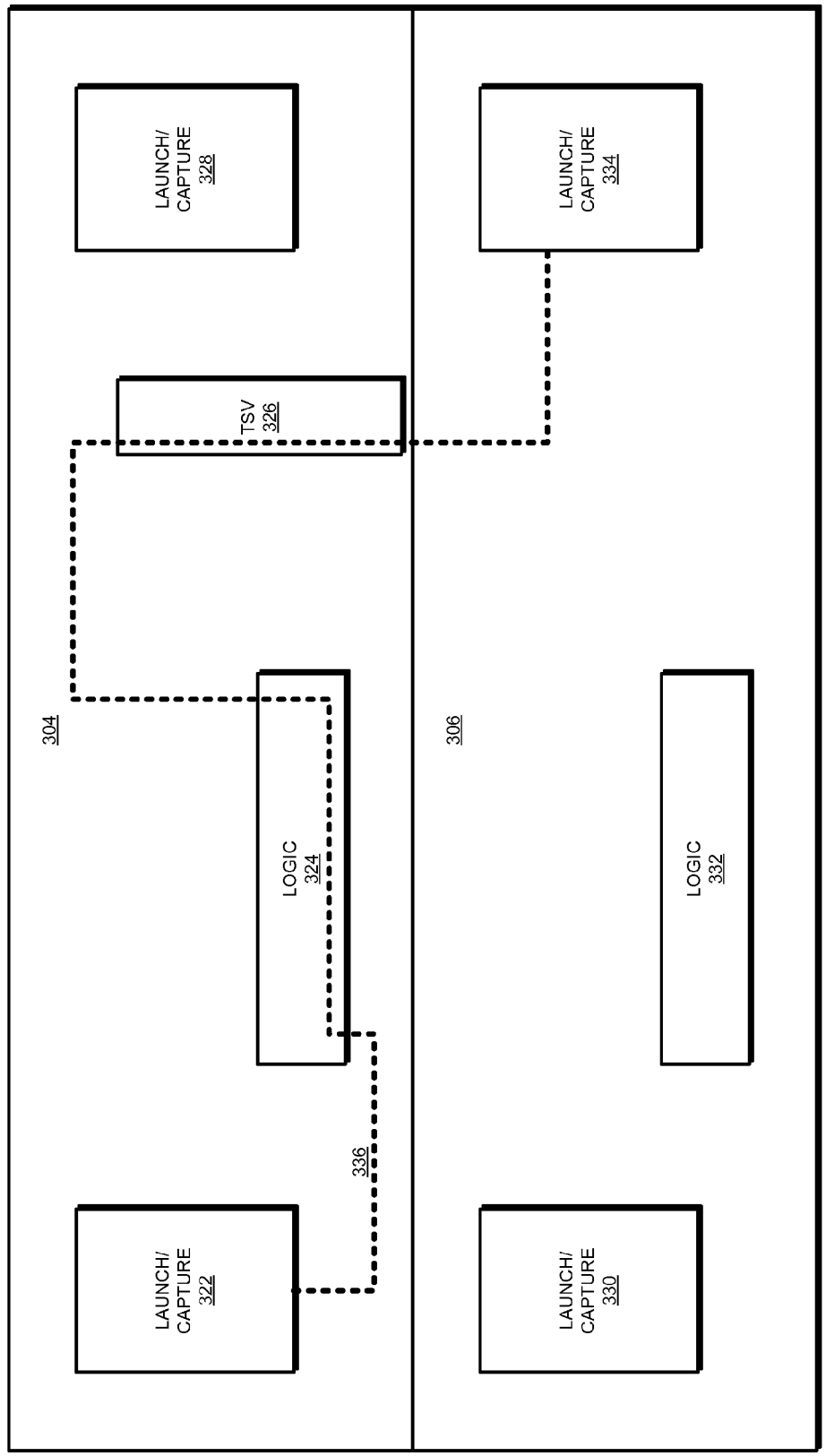
FIG. 3B depicts a block diagram of another example delay path configured for a performance measurement using an infrastructure in accordance with an illustrative embodiment.

With reference to FIG. 3B, this figure depicts a block diagram of another example delay path configured for a performance measurement using an infrastructure in accordance with an illustrative embodiment. Certain components of the infrastructure, such as the multiplexers, controller, or sensors (edge detectors), are not depicted for the clarity of the drawing and the description.

Chips 304 and 306 may each be similar to chip 302 in FIG. 3A so far as they each implement part 200 of the infrastructure according to FIG. 2. Note that chips 304 and 306 may contain different function circuits.

Launch and capture blocks 322, 328, 330, and 334 may be analogous to block 314 in FIG. 3A. Logic 324 may be a delay component in chip 304 in a manner similar to logic 316 in FIG. 3A. Logic 332 may be a delay component in chip 306 in a manner similar to logic 316 in FIG. 3A.

An embodiment or depiction is not intended to imply that logic of the various chips, such as logic 324 and 332 are functionally similar to one another. Functionally different logic, or generally any type of chip resource or component that may participate in a path, or a combination thereof, may be used as substitutes for logic 324 or 332 within the scope of the invention.

Furthermore, logic 324 and 332 may be subjected to different conditions, such as temperatures that are different from one another, voltages that are different from one another, or frequencies that are different from one another, to simulate the operating conditions in a stacked configuration.

Additionally, an infrastructure according to an embodiment may be able to configure the delay paths more specifically, differently, or with more granularity. For example, certain parts (not shown) of the infrastructure according to an embodiment may be used to configure the logic (local delay path), such as for configuring the composition of logic 324, 332, or both.

Path 336 is a path created using components of the infrastructure implemented in chips 304 and 306, for example, by using one or more controllers and one or more multiplexers (not shown). For example, a controller may signal certain multiplexers to activate the signal path between block 322 and logic 324, between logic 324 and TSV 326, and between TSV 326 and block 334 in chip 306, such that path 336 is formed. A sensor, such as any of edge detectors 256, 260, 264, or 268 in FIG. 2 (not shown in FIG. 3B) may then detect a delay along path 336, including delay imparted by TSV 326.

Configured in this manner, a signal being launched in chip 304, traversing a delay path through chip 304 and chip 306 using TSV 326, and being captured in chip 306, can be evaluated to determine a performance characteristic of path 336. Thus, a performance characteristic of a delay path in chip 304 and chip 306 in a contemplated 3D stack can be evaluated while keeping chips 304 and 306 in single-stratum mode.

Figure 3C:
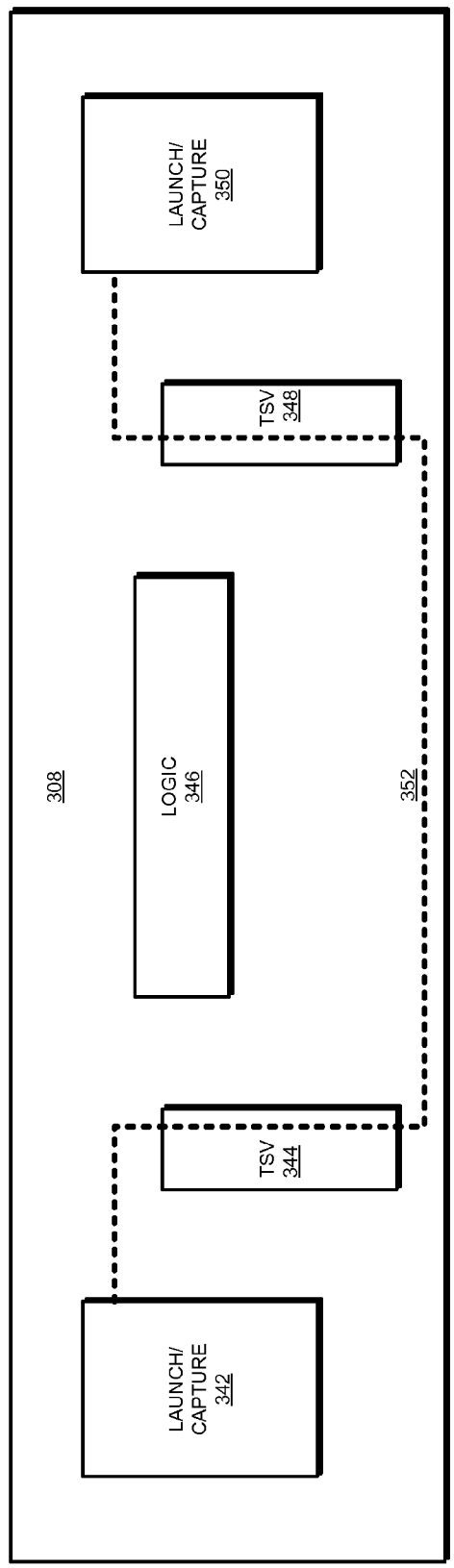
FIG. 3C depicts a block diagram of another example delay path configured for a performance measurement using an infrastructure in accordance with an illustrative embodiment.

With reference to FIG. 3C, this figure depicts a block diagram of another example delay path configured for a performance measurement using an infrastructure in accordance with an illustrative embodiment. Certain components of the infrastructure, such as the multiplexers, controller, or sensors (edge detectors), are not depicted for the clarity of the drawing and the description.

Chips 308 may be similar to chip 302 in FIG. 3A so far as chip 308 implements part 200 of the infrastructure according to FIG. 2.

Launch and capture blocks 342 and 350 may be analogous to blocks 322 and 328 respectively in FIG. 3B. Logic 346 may be a delay component in chip 308 in a manner similar to logic 324 in FIG. 3B. Generally, logic 346 may be as diverse as described with respect to logic 328 or 332 in FIG. 3B.

Path 352 is a path created using components of the infrastructure implemented in chip 308, for example, by using a controller and one or more multiplexers (not shown). For example, a controller may signal certain multiplexers to activate the signal path between block 342 and TSV 344, between TSV 344 and TSV 348, and between TSV 348 and block 350, such that path 352 is formed. A sensor, such as any of edge detectors 256, 260, 264, or 268 in FIG. 2 (not shown in FIG. 3C) may then detect a delay along path 352, including delay imparted by TSVs 344 and 348. A signal is launched in chip 308 and traverses a delay path through chip 308's TSVs 344 and 348 as if the signal was delivered to and subsequently received from another chip without actually doing so.

Configured in this manner, a signal being launched in chip 308, traversing a path using TSV 344 and 348, and being captured in chip 308, can be evaluated to determine a performance characteristic of path 352. Thus, a performance characteristic of a delay path in chip 308 in a contemplated 3D stack can be evaluated while keeping chip 308 in single-stratum mode.

Wrap back from one TSV in a chip to another TSV in the same chip can be performed using a tester board and open TSVs in the chip. For example, a probe can route a signal from one open TSV to another open TSV in a chip. Alternatively, some TSVs can be hardwired through the chip's metal layer to act as wrap back TSVs.

Figure 3D:
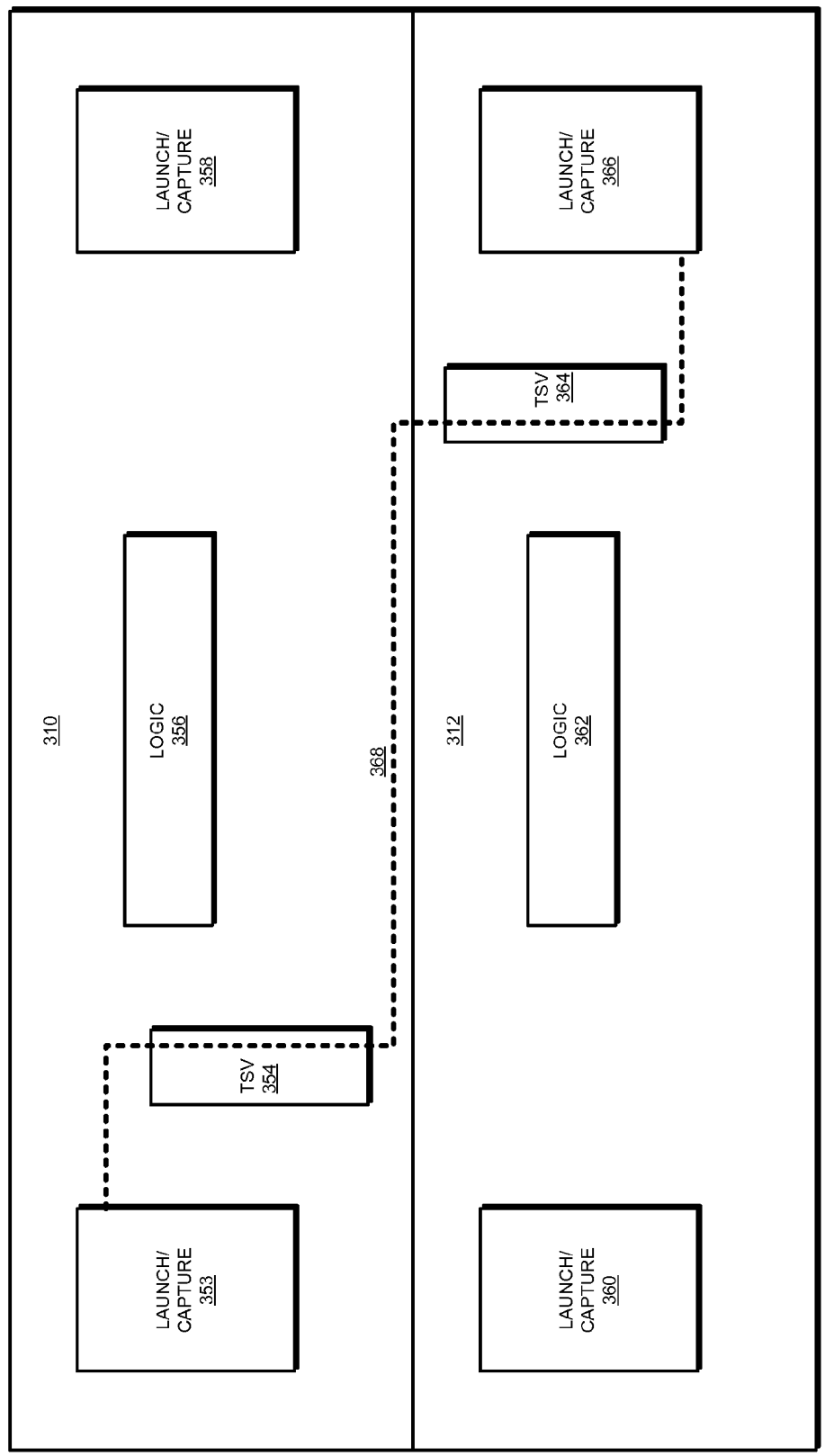
FIG. 3D depicts a block diagram of another example delay path configured for a performance measurement using an infrastructure in accordance with an illustrative embodiment.

With reference to FIG. 3D, this figure depicts a block diagram of another example delay path configured for a performance measurement using an infrastructure in accordance with an illustrative embodiment. Certain components of the infrastructure, such as the multiplexers, controller, or sensors (edge detectors), are not depicted for the clarity of the drawing and the description.

Chips 310 and 312 may each be analogous to chip 308 in FIG. 3C so far as they each implement part 200 of the infrastructure according to FIG. 2. Note that chips 310 and 312 may contain different function circuits.

Launch and capture blocks 353, 358, 360, and 366 may be analogous to block 342 in FIG. 3C. Logic 356 may be a delay component in chip 310 in a manner similar to logic 346 in FIG. 3C. Logic 362 may be a delay component in chip 312 in a manner similar to logic 346 in FIG. 3C. Generally, logic 356 and 362 may each be as diverse as described with respect to logic 328 or 332 in FIG. 3B.

Path 368 is a path created using components of the infrastructure implemented in chips 310 and 312, for example, by using one or more controllers and one or more multiplexers (not shown). For example, a controller may signal certain multiplexers to activate the signal path between block 353 and TSV 354, between TSV 354 in chip 310 and TSV 364 in chip 312, and between TSV 364 and block 366 in chip 312, such that path 368 is formed. A sensor, such as any of edge detectors 256, 260, 264, or 268 in FIG. 2 (not shown in FIG. 3B) may then detect a delay along path 368, including delay imparted by TSVs 354 and 364.

Configured in this manner, a signal being launched in chip 310, traversing a delay path through chip 310 and chip 312 using TSVs 354 and 364, and being captured in chip 312, can be evaluated to determine a performance characteristic of path 368. Thus, a performance characteristic of a delay path in chip 310 and chip 312 in a contemplated 3D stack can be evaluated while keeping chips 310 and 312 in single-stratum mode.

Figure 4:
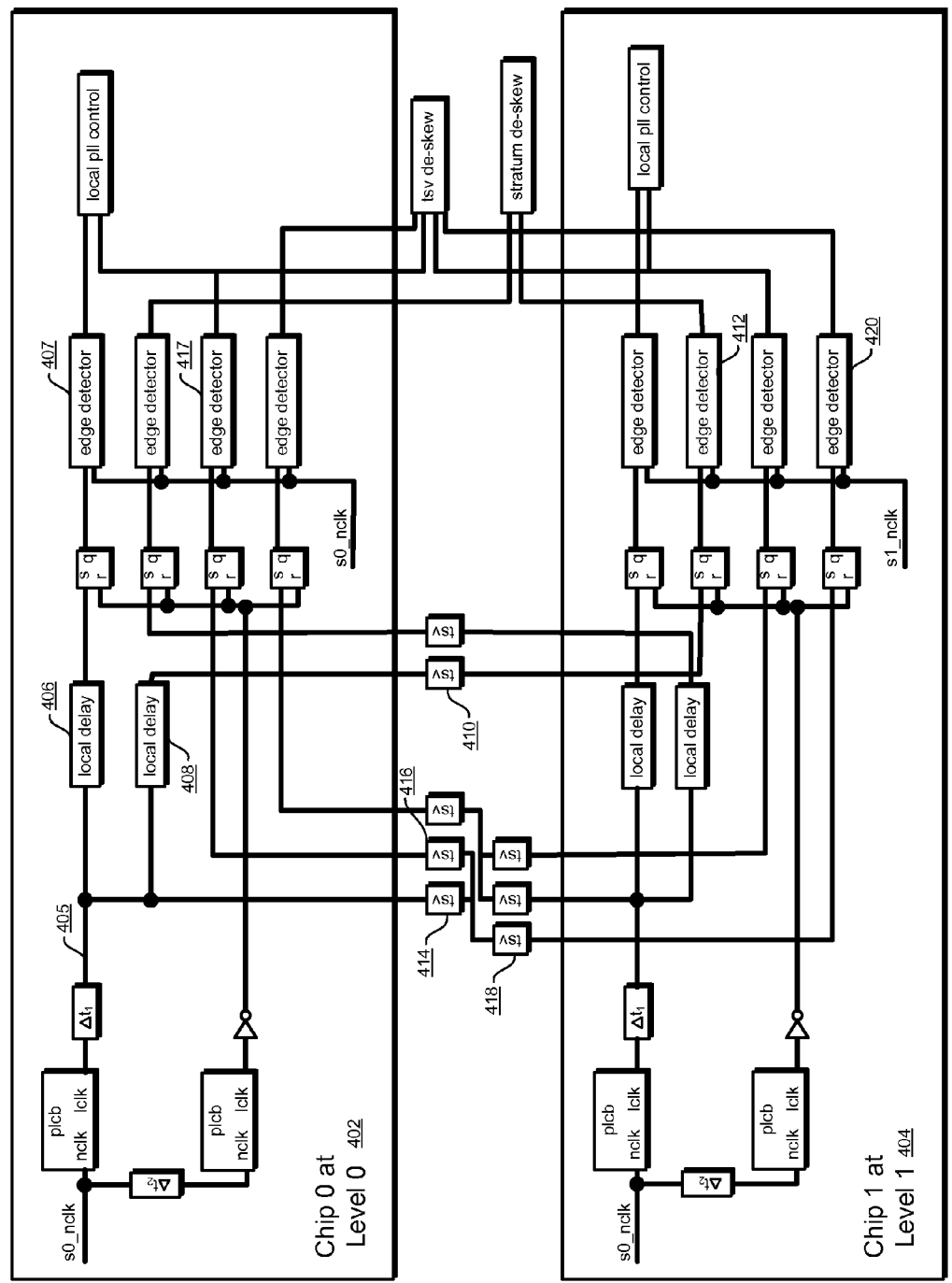
FIG. 4 depicts a block diagram of an example configuration for testing example delay paths using an infrastructure in accordance with an illustrative embodiment.

With reference to FIG. 4, this figure depicts a block diagram of an example configuration for testing example delay paths using an infrastructure in accordance with an illustrative embodiment. Chip 402 may be chip 0 at level 0 in a contemplated 3D stack. Chip 404 may be chip 1 at level 1 in the contemplated 3D stack. Chips 402 and 404 may be analogous to chips 310 and 312 respectively in FIG. 3D.

FIGS. 3A-D describe in a conceptual manner how example 3D delay paths can be created using the infrastructure of an embodiment. FIG. 4 describes how a part of the infrastructure circuit may be implemented to create similar example 3D delay paths using the infrastructure.

For example, in one delay path, a signal may launch at point 405 in chip 402, traverse local delay 406 in chip 402, and be captured at edge detector 407 in chip 402. Thus, a path analogous to path 320 in FIG. 3A can be formed in chip 402 without actually stacking chips 402 and 404.

As another example, in another delay path, a signal may launch at point 405 in chip 402, traverse local delay 408 in chip 402, pass through chip 402's TSV 410, and be captured at edge detector 412 in chip 404. Thus, a path analogous to path 336 in FIG. 3B can be formed in chips 402 and 404 without actually stacking chips 402 and 404.

As another example, in another delay path, a signal may launch at point 405 in chip 402, pass through chip 402's TSV 414, wrap around and pass back through chip 402's TSV 416, and be captured at edge detector 417 in chip 402. Thus, a path analogous to path 352 in FIG. 3C can be formed in chip 402 without actually stacking chips 402 and 404.

As another example, in another delay path, a signal may launch at point 405 in chip 402, pass through chip 402's TSV 414, pass through chip 404's TSV 418, and be captured at edge detector 420 in chip 404. Thus, a path analogous to path 368 in FIG. 3D can be formed in chip 402 without actually stacking chips 402 and 404.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and apparatus are provided in the illustrative embodiments for an infrastructure for performance-based chip-to-chip stacking. Using an embodiment of the invention, a stack's performance can be determined prior to committing the chips to a stack.

An embodiment can be used chips with synchronous clocks as well as asynchronous clocks. For example, when implemented with respect to a stack that includes only those chips that operate at a common frequency, an embodiment allows capturing layer-to-layer jitter. Using an embodiment, a delay path can be tested within a single layer, layer-to-layer, or in a layer through a TSV chain. Each edge detector can be supplied an independent clock in such a configuration.

For example, an embodiment may be used for measuring the TSV based interface in an asynchronous stack where the infrastructure in a chip is used for measuring the timing of the boundary. The infrastructure in a chip may also be used for measuring logic and delay paths on the chip's own stratum. Although using separate clocks, asynchronous paths can be measured to detect the phase or time difference between the paths or to measure the effectiveness of the boundary using an embodiment.

When implemented with respect to a stack that includes asynchronous chips-chips that operate at different frequencies, an embodiment allows testing delay paths within a single layer, single layer through TSV, and through a TSV chain. Output from an embodiment can be passed to a stack controller.

An embodiment may improve the stack's performance without having to commit and perform post-commit manipulations of the stack. For example, an inherently hot chip may be selected as a candidate chip for a stack, but a suitable position in the stack can be determined for that chip before performing the stacking such that the chip's temperature remains within the allowed tolerances. An embodiment may also improve the power consumption and other performance parameters of the stacked design post-stacking. An embodiment may be implemented to use rules or policies for the stacking in addition to the single stratum design-time information about the candidate chips.

The various embodiments have been described with respect to performance-based stacking using certain performance parameters only as a generic example. Many types of performance considerations for optimizing a stack will be apparent from this disclosure to those of ordinary skill in the art and the same are contemplated within the scope of the invention. For example, within the scope of the invention, an implementation of an embodiment may be based on an energy parameter, such as for minimizing the overall energy consumption or energy loss. In other words, an implementation may focus on energy performance of the stack as the performance of concern within the scope of the invention.

As another example, within the scope of the invention, an implementation of an embodiment may be based on a reliability parameter, such as for improving the reliability performance of the resulting stack even if the stack is relatively energy inefficient or of suboptimal performance. In other words, an implementation may focus on reliability performance of the stack as the performance of concern within the scope of the invention.

The embodiments are described using 3D-stacking only for the clarity of the description and not as a limitation on the invention. An embodiment is similarly usable for 3D stacking of chips, MCM configurations of chips, and generally any configuration that places two or more chips together in a single package.

Furthermore, the embodiments are described using chip-to-chip stacking only as the simplest example configuration of describing the problem that the invention identifies and the solution that an embodiment offers. The applicability of an embodiment or the invention as a whole is not intended to be limited to chip-to-chip stacking configurations. For example, an embodiment is also usable for similar measurements when a chip is being coupled with a MCM configuration that may already be bonded in a package. An embodiment is also similarly usable for when two already bonded MCM packages are being coupled or stacked together. For example, an embodiment may use an MCM interconnect or a wrapped package interconnect to determine the timing of the interconnect in the manner described using two or more chips.

As will be appreciated by one skilled in the art, aspects of the present invention may be embodied as a system, method, apparatus, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed.

Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for performance-based chip-to-chip stacking, the method comprising:
   configuring a critical path monitor circuit (infrastructure) to launch a signal from a launch point in a first layer, the first layer being a first circuit;
   further configuring the infrastructure to create an electrical path to a capture point;
   launching the signal from the launch point in the first layer; and
   measuring a performance characteristic of the electrical path resulting in a measurement, wherein the measurement is indicative of a performance that the first layer provides when the first layer and a second layer are actually stacked in a 3D stack, wherein the measurement is performed without actually stacking the first and the second layers in the 3D stack, the second layer being a second circuit.

2. The method of claim 1, further comprising:
   tuning a programmable delay in the first layer to apply a delay to the signal, wherein the delay compensates for a variation between the design and manufacturing of a component in the electrical path, the tuning being performed when the first and the second layers are not stacked in the 3D stack.

3. The method of claim 1, further comprising:
   tuning a programmable delay in the first layer to apply a delay to the signal, wherein the delay compensates for a variation in a characteristic of a component in the electrical path, the characteristic having a first value when the first and the second layers are not stacked, and the characteristic having a second value when the first and the second layers are stacked in the 3D stack, the tuning being performed when the first and the second layers are stacked in the 3D stack.

4. The method of claim 1, wherein the capture point is in the first layer.

5. The method of claim 1, wherein the capture point is in the second layer.

6. The method of claim 1, wherein the electrical path traverses a front-end macro in the first layer.

7. The method of claim 1, wherein the electrical path traverses a first through silicon via (TSV) in the first layer.

8. The method of claim 1, wherein the electrical path traverses a first TSV in the first layer and a second TSV in the second layer.

9. The method of claim 1, wherein the electrical path traverses a first TSV in the first layer and a second TSV in the first layer.

10. The method of claim 1, wherein the first and the second layers are asynchronous.

11. The method of claim 1, wherein the first and the second layers are synchronous.

12. The method of claim 1, wherein at least one of (i) the first circuit and (ii) the second circuit is a multi-chip-module (MCM) that is already bonded as a package.

13. The method of claim 1, wherein at least one of (i) the first circuit and (ii) the second circuit is an integrated circuit (IC).

14. The method of claim 1, wherein the first circuit and the second circuit are being stacked such that the first and the second circuits are in a common two-dimensional plane.

15. The method of claim 1, wherein any number of third layers are to be stacked between the first and the second layers, and wherein the electrical path traverses from the first layer through the third layers and to the second layer while the first, second, and third layers are not actually stacked.

16. The method of claim 15, wherein the infrastructure comprises a set of multiplexers, a controller, and a set of edge detectors, wherein the electrical path is formed by activating a subset of multiplexers using the controller, and the measuring is performed using an edge detector in the set of edge detectors.

17. The method of claim 1, wherein configuring the infrastructure to create the electrical path to the capture point further includes:
   configuring the infrastructure to create a specific local delay component.

18. A system for performance-based chip-to-chip stacking, the system comprising:
   A first circuit forming a first layer; and
   a critical path monitor circuit (infrastructure) configured to:
   launch a signal from a launch point in the first layer;
   create an electrical path to a capture point, and measuring a performance characteristic of the electrical path resulting in a measurement, wherein the measurement is indicative of a performance that the first layer provides when the first layer and a second layer are actually stacked in a 3D stack, wherein the measurement is performed without actually stacking the first and the second layers in the 3D stack, the second layer being a second circuit.

19. The system of claim 18, wherein the critical path monitor circuit is further configured to:
   tune a programmable delay in the first layer to apply a delay to the signal, wherein the delay compensates for a variation between the design and manufacturing of a component in the electrical path, the tuning being performed when the first and the second layers are not stacked in the 3D stack.

20. The system of claim 18, wherein the critical path monitor circuit is further configured to:
   tune a programmable delay in the first layer to apply a delay to the signal, wherein the delay compensates for a variation in a characteristic of a component in the electrical path, the characteristic having a first value when the first and the second layers are not stacked, and the characteristic having a second value when the first and the second layers are stacked in the 3D stack, the tuning being performed when the first and the second layers are stacked in the 3D stack.

* * * * *